United States Patent [19]

Takahashi

[11] Patent Number: 5,714,908
[45] Date of Patent: Feb. 3, 1998

[54] POWER CORRECTION METHOD AND CIRCUIT

[75] Inventor: Chusei Takahashi, Tokyo, Japan

[73] Assignee: Oki Electric Industry Co., Ltd., Tokyo, Japan

[21] Appl. No.: 607,245

[22] Filed: Feb. 26, 1996

[30] Foreign Application Priority Data

Mar. 20, 1995 [JP] Japan .................................... 7-060242

[51] Int. Cl.$^6$ .................................................. H03G 3/20
[52] U.S. Cl. .................................... 330/137; 330/279
[58] Field of Search ........................... 330/129, 137, 330/279; 455/116, 127

[56] References Cited

U.S. PATENT DOCUMENTS 3,258,711  6/1966  Searl et al. ............................ 330/137
5,208,550  5/1993  Iwane .................................. 330/279 X

*Primary Examiner*—James B. Mullins
*Attorney, Agent, or Firm*—Spencer & Frank

[57] ABSTRACT

An amplifier amplifies a signal derived from the output of a voltage-controlled oscillator. The frequency control voltage applied to the voltage-controlled oscillator is also applied, after suitable level conversion, to the amplifier as a gain control signal, to correct frequency-dependent power deviation of the amplifier.

12 Claims, 2 Drawing Sheets

POWER CORRECTION METHOD AND CIRCUIT

BACKGROUND OF THE INVENTION

The present invention relates to a method and circuit for controlling the output power of an amplifier so as to correct frequency-dependent power deviation.

A conventional method of power control employs a feedback loop comprising a coupler and an automatic power control (APC) circuit. The coupler couples part of the output of the amplifier into the APC circuit, which detects the power of the coupled signal, generates a control signal responsive to the difference between the detected power and a target value, and uses the control signal to control the gain of the amplifier so as to reduce the above-mentioned difference to zero. In theory, the amplifier output can thus be held at a desired constant power level.

In practice, however, certain problems tend to occur. One is that impedance mismatch between the amplifier and its load causes signal reflection at the load. Interference between the output signal and the reflected signal then creates variations in the coupler output which are unrelated to the output power of the amplifier, leading to inappropriate control.

Another problem is that at low power levels, the signal coupled into the APC circuit may be too weak for the APC circuit to detect. Solving this problem by coupling a larger portion of the amplifier's output power into the APC circuit is undesirable, because that would reduce the useful output power of the amplifier. Amplifying the coupler output is also an undesirable solution, because the benefit thus gained must be balanced against the size, cost, and power consumption of the added amplification circuitry.

A further problem is that an APC circuit does not in general have a flat frequency characteristic, so even if the desired power is obtained at one frequency, it may not be obtained at other frequencies. Constant output power is typically obtained in only a narrow frequency range.

SUMMARY OF THE INVENTION

It is accordingly an object of the present invention to control the output power of an amplifier so that constant power is obtained over a wide range of frequencies.

Another object of the invention is to control the output power of an amplifier without diverting any of the amplifier output for control purposes.

Still another object is to control the output power of an amplifier in a manner unaffected by signal reflection at the load.

The invented method of power correction is used to control the output power of an amplifier that amplifies a signal derived from the output of a voltage-controlled oscillator. The oscillation frequency of the voltage-controlled oscillator is controlled by a frequency control voltage applied to the voltage-controlled oscillator. The invented method comprises applying the frequency control voltage to the amplifier as a gain control voltage.

The invented method may also comprise converting the voltage of the frequency control voltage according to a certain law in order to produce the gain control voltage. The conversion law may be a fixed law. Alternatively, the conversion law can be varied responsive to the desired amplifier output power, or to data specifying the desired oscillation frequency of the voltage-controlled oscillator.

DETAILED DESCRIPTION OF THE INVENTION

An embodiment of the invention will be described with reference to the attached illustrative drawings.

Figure 1:
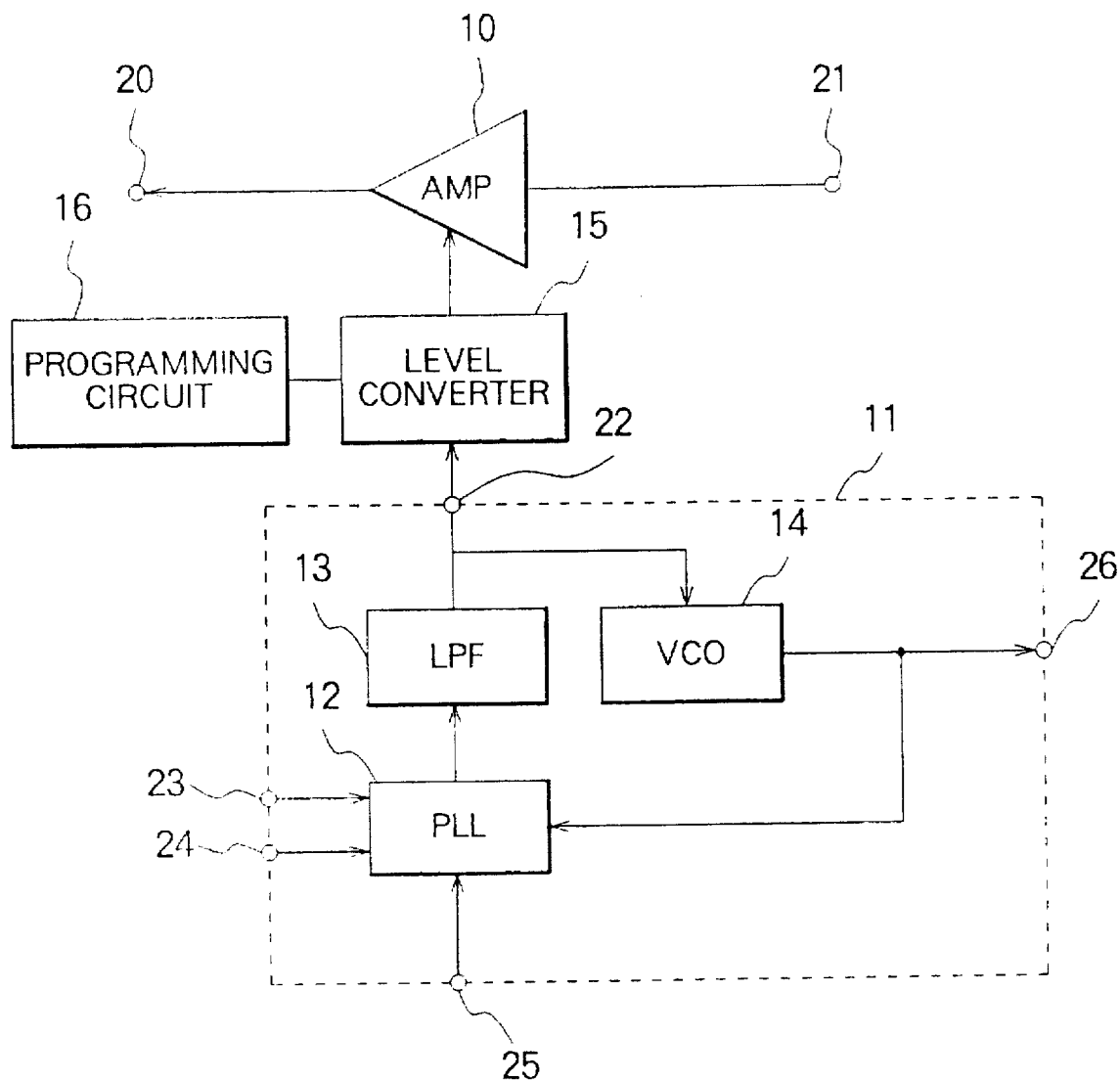
FIG. 1 is a block diagram illustrating an embodiment of the invention.

Referring to FIG. 1, the amplifier 10 is, for example, the power amplifier of a mobile communication system. The signal amplified by the amplifier 10 is derived from a periodic signal output by a frequency synthesizing circuit 11 comprising a phase-locked loop (PLL) circuit 12, a low-pass filter (LPF) 13, and a voltage-controlled oscillator (VCO) 14. The invented power correction circuit comprises a level converter 15 coupled between the amplifier 10 and frequency synthesizing circuit 11, and a programming circuit 16 that controls the level converter 15.

The following input and output terminals are indicated in FIG. 1: an amplifier output terminal 20; an amplifier input terminal 21; a control voltage output terminal 22; a frequency programming terminal 23; an enable terminal 24; a reference frequency input terminal 25; and a periodic signal output terminal 26.

The PLL circuit 12 is a well-known circuit that, when enabled by input at terminal 24, divides the frequency of the periodic signal, which is output by the VCO 14, according to serial data input at terminal 23, divides the fixed frequency of the signal input at terminal 25 by a fixed amount, compares the phase of the two resulting divided signals, and generates a voltage output signal representing the phase difference. The LPF 13 smoothes the output of the PLL circuit 12, and applies the resulting smoothed signal as a frequency control voltage signal to the VCO 14. The VCO 14 generates the periodic signal, which has a frequency responsive to this control voltage, and supplies the periodic signal to terminal 26, as well as to the PLL circuit 12.

The periodic signal output at terminal 26 accordingly has a frequency responsive to the serial data input at terminal 23. In a communication system, these serial data may select different channels.

The periodic signal output at terminal 26 is supplied as, for example, a carrier signal to a circuit such as a mixing circuit (not shown), which generates a transmit signal to be amplified by the amplifier 10. This transmit signal, which is input at terminal 21, has a frequency equal to the frequency of the periodic signal output at terminal 26, or a frequency derived from that frequency. For simplicity, in the following description it will be assumed that the frequencies at terminals 26 and 21 are equal.

Figure 2:
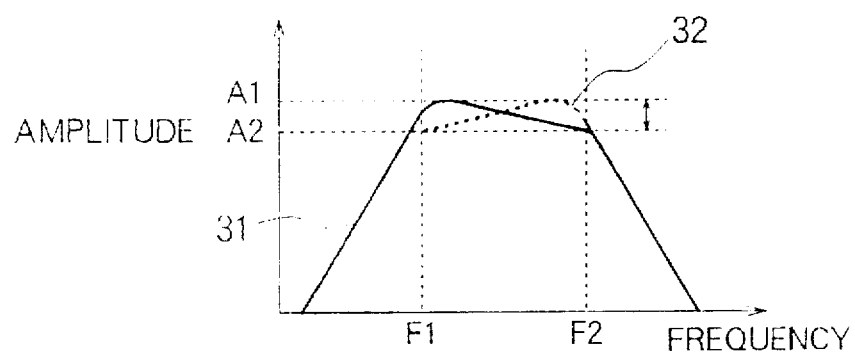
FIG. 2 is a graph illustrating the frequency response of the amplifier in FIG. 1.

The amplifier 10 is a variable-gain amplifier, the gain of which is controlled by input of a gain control voltage. FIG. 2 illustrates the frequency response characteristic of the amplifier 10 for a fixed gain setting. The frequency of the signal input at terminal 21 is indicated on the horizontal axis. The amplitude of the signal output at terminal 20 is indicated on the vertical axis. Amplitude corresponds to power (being proportional to the square root of power).

The frequencies input at terminal 21 lie between two frequency values F1 and F2. The range of frequencies between F1 and F2 will be referred to as the passband of the amplifier 10.

Within the passband, the amplifier 10 ideally has a flat amplitude-frequency characteristic. Actual amplifiers, rarely have perfectly flat characteristics. Some amplifiers have characteristics that slope generally downward toward the higher frequencies within the passband, as illustrated by the solid line 31. Other amplifiers have characteristics that slope generally upward toward the higher frequencies, as illustrated by the dotted line 32. The amplitude accordingly varies between two values A1 and A2, even though the gain is fixed, causing a frequency-dependent power deviation in the amplifier output.

Figure 3:
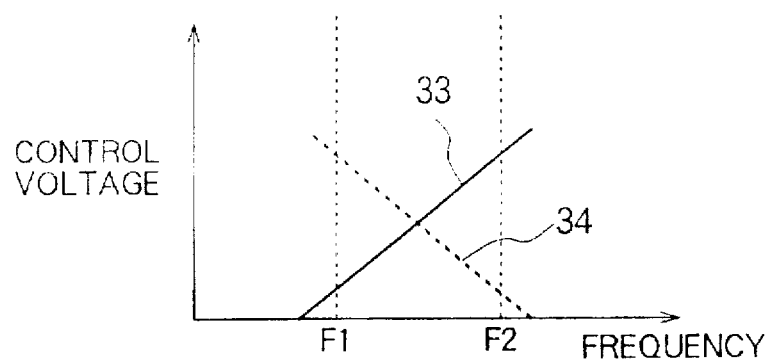
FIG. 3 is a graph illustrating the voltage-frequency characteristic of the frequency synthesizing circuit in FIG. 1.

FIG. 3 illustrates the control characteristic of the frequency synthesizing circuit 11. The oscillation frequency of the VCO 14 is indicated on the horizontal axis. The control voltage output by the LPF 13 is indicated on the vertical axis. Within the band between F1 and F2, the control characteristic is substantially linear, either sloping upward as indicated by the solid line 33 or downward as indicated by the dotted line 34.

Next the operation of the invention will be described.

As explained above, when supplied with data at terminal 23 and enabled by input at terminal 24, the frequency synthesizing circuit 11 generates a frequency control voltage at terminal 22 and a periodic signal at terminal 26, and the periodic signal is processed by other circuits (not visible) to create the input signal at terminal 21, which is amplified by the amplifier 10. The level converter 15 converts the frequency control voltage output at terminal 22 to a gain control voltage, which is supplied to the amplifier 10. The conversion law has, for example, the form $$y=Ax+B$$

where x is the frequency control voltage input to the level converter 15, and y is the gain control voltage output from the level converter 15. The value of A is adapted so that the control characteristic in FIG. 3 compensates for the amplitude-frequency characteristic in FIG. 2. The value of B is controlled by the programming circuit 16 so as to obtain a desired output power level.

For example, if the amplifier 10 has the frequency response indicated by curve 31 in FIG. 2, parameter A is selected so that the gain becomes higher at frequencies near F2 than at frequencies near F1. If the gain is proportional to the gain control voltage, and if the frequency synthesizing circuit 11 has the control characteristic shown by the solid line 33 in FIG. 3, this means that A should have a positive value.

Figure 4:
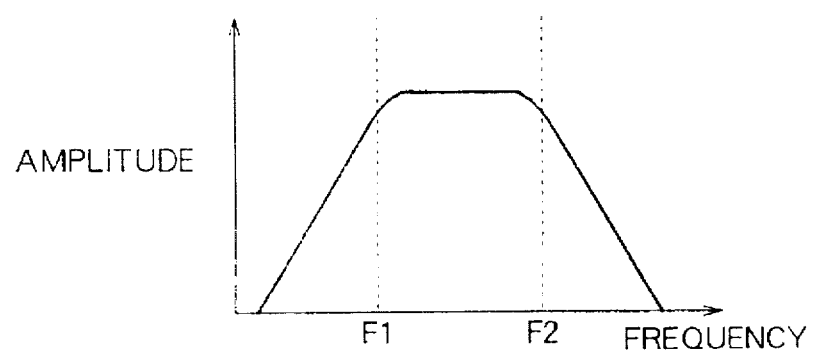
FIG. 4 is a graph illustrating the corrected amplitude-frequency characteristic of the amplifier in FIG. 1.

Because of this compensatory gain control, the amplifier 10 operates with the amplitude-frequency characteristic shown in FIG. 4. Within the passband, substantially the same output amplitude (power) is obtained for all input frequencies.

In this way, the invented method controls the output power of the amplifier 10 without using any of this output power for control purposes. The invented control method is therefore unaffected by signal reflection at the load (not shown) to which the amplifier 10 is connected, and a constant output power can be obtained over a broad range of frequencies.

The invented method requires only a level converter 15 coupled between the amplifier 10 and frequency synthesizing circuit 11, and a programming circuit 16 to control the level converter 15. This is less circuitry than found in conventional automatic power control circuits. If the output power need not be varied, then the circuitry can be further reduced by eliminating the programming circuit 16 and using, for example, a single resistor coupled between the amplifier 10 and frequency synthesizing circuit 11 as the level converter 15. The resistance value of the resistor can be selected to obtain a flat output characteristic as shown in FIG. 4.

The programming circuit 16 may also be adapted to control the level converter 15 responsive to the serial data supplied to the PLL circuit 12 at terminal 23. The invented method can then compensate automatically not only for amplitude-frequency characteristics with a simple upward or downward trend as shown in FIG. 2, but for more complex characteristics, such as those exhibiting ripple.

Although the preceding embodiment controlled only a single amplifier, the control voltage from the frequency synthesizing circuit 11 can also be used to control the gain of a more complex system. An example would be a system having two or more amplifier stages, such as a broadband amplifier stage followed by a narrow-band amplifier stage. The narrow-band amplifier stage may function as a low-pass filter, a high-pass filter, or a bandpass filter.

Applications of the present invention are not limited to the control of amplifiers in communication systems.

Those skilled in the art will recognized that further modifications can be made to the preceding embodiment within the scope of the invention as claimed below.

What is claimed is:

1. A method of correcting the power of the output of an amplifier that has a variable gain, and that amplifies a first signal derived from a second signal output by a voltage-controlled oscillator, the frequency of said second signal being controlled by a frequency control voltage applied to said voltage-controlled oscillator, comprising the step of:

applying said frequency control voltage to said amplifier as a gain control voltage, thereby controlling the gain of said amplifier.

2. The method of claim 1, comprising the further step of converting a voltage level of said frequency control voltage before application of said frequency control voltage to said amplifier.

3. The method of claim 2, wherein the voltage level of said frequency control signal is converted responsive to a desired output power level of said amplifier.

4. The method of claim 2, wherein the voltage level of said frequency control signal is converted responsive to data specifying a desired frequency of said second signal.

5. A power correction circuit for correcting the power of the output of an amplifier that amplifies a first signal derived from a second signal output by a voltage-controlled oscillator, the frequency of said second signal being controlled by a frequency control voltage applied to said voltage-controlled oscillator, comprising:

a level converter coupled to said voltage-controlled oscillator, for receiving said frequency control voltage, converting said frequency control voltage to a gain control voltage according to a certain conversion law, and supplying said gain control voltage to said amplifier, thereby controlling a gain of said amplifier.

6. The circuit of claim 5, wherein said level converter is a resistor.

7. The circuit of claim 5, further comprising a programming circuit coupled to said level converter 15, for selecting said conversion law.

8. The circuit of claim 7, wherein said programming circuit selects said conversion law responsive to a desired output power level of said amplifier.

9. The circuit of claim 7, wherein said programming circuit selects said conversion law responsive to data specifying a desired frequency of said second signal.

10. An apparatus comprising:

an amplifier having a signal input, a gain input for receiving a gain control voltage, and an output;

a first circuit having an input and an output coupled to the gain input of the amplifier, the first circuit converting a frequency control voltage received at its input to the gain control voltage and producing the gain control voltage at its output; and a voltage-controlled oscillator having an input coupled to the input of the first circuit and an output coupled to the signal input of the amplifier, the voltage-controlled oscillator receiving at its input the frequency control voltage.

11. The apparatus of claim 10, wherein the first circuit is a resistor.

12. The apparatus of claim 10, wherein the first circuit has a second input, and further comprising:

a programming circuit having an output coupled to the second input of the first circuit for controlling the converting by the first circuit of the frequency control voltage to the gain control voltage.

* * * * *